United States Patent [19]

Ichiyama

[11] Patent Number: 4,974,052
[45] Date of Patent: Nov. 27, 1990

[54] PLASTIC PACKAGED SEMICONDUCTOR DEVICE

[75] Inventor: Hideyuki Ichiyama, Itami, Japan

[73] Assignee: Mitsubishi Denki Kabushiki Kaisha, Japan

[21] Appl. No.: 284,721

[22] Filed: Dec. 14, 1988

[51] Int. Cl.$^5$ .............................................. H01L 23/48
[52] U.S. Cl. ........................................ 357/67; 357/72; 357/74; 437/209
[58] Field of Search ................ 357/74, 72, 68, 67; 437/187, 194, 204, 209

[56] References Cited

U.S. PATENT DOCUMENTS

| | | | |
|---|---|---|---|
| 3,953,877 | 4/1976 | Sigusch et al. | 357/72 |
| 4,001,870 | 1/1977 | Saiki et al. | 357/72 |
| 4,005,455 | 1/1977 | Watrous, Jr. et al. | 357/72 |
| 4,017,886 | 4/1977 | Tomono et al. | 357/72 |
| 4,060,828 | 11/1977 | Satonaka | 357/72 |
| 4,733,289 | 3/1988 | Tsurumaru | 357/72 |
| 4,821,148 | 4/1989 | Kobayashi et al. | 357/72 |
| 4,853,761 | 8/1989 | Ikeda | 357/72 |
| 4,926,238 | 5/1990 | Mukai et al. | 357/72 |

FOREIGN PATENT DOCUMENTS

| | | | |
|---|---|---|---|
| 0086122 | 6/1980 | Japan | 437/187 |
| 0013139 | 3/1982 | Japan | 437/204 |
| 0202749 | 12/1982 | Japan | 437/194 |
| 0066149 | 4/1984 | Japan | 357/209 |
| 59-151852 | 9/1984 | Japan | 357/52 |
| 60-46038 | 3/1985 | Japan | 357/67 |
| 60-103655 | 7/1985 | Japan . | |
| 0081658 | 4/1986 | Japan | 357/74 |
| 61-102758 | 5/1986 | Japan | 357/72 |
| 0139037 | 6/1986 | Japan | 437/194 |
| 61-289652 | 12/1986 | Japan | 357/67 |
| 62-21250 | 1/1987 | Japan | 357/72 |
| 0252948 | 11/1987 | Japan | 357/74 |
| 62-282453 | 12/1987 | Japan | 357/72 |

Primary Examiner—Andrew J. James
Assistant Examiner—Minh Loan Tran
Attorney, Agent, or Firm—Leydig, Voit & Mayer

[57] ABSTRACT

A plastic packaged semiconductor device includes a semiconductor chip with electrodes formed on the surface thereof, a package body made of resin molded to the semiconductor chip, and an adhesion improving film formed on those portions of the surface of the semiconductor chip which surround the electrodes for enhancing the adhesion of the semiconductor chip to the package body.

5 Claims, 3 Drawing Sheets

PLASTIC PACKAGED SEMICONDUCTOR DEVICE

BACKGROUND OF THE INVENTION

1. Field of the Invention

The present invention relates to a plastic packaged semiconductor device, and, more particularly, to a structure surrounding electrodes of a semiconductor chip packaged in an epoxy resin.

2. Description of the Related Art

FIG. 1 shows the vicinity of an electrode of a semiconductor chip in a conventional plastic packaged semiconductor device. The conventional plastic packaged semiconductor device includes a Si substrate 1 for a semiconductor chip, an insulating film 2 made of $SiO_2$ which is disposed on the Si substrate 1, an Al electrode 3 disposed on a suitable portion of the insulating film 2, and a fine metallic wire 4 made of Au, which is bonded at one end to the upper surface of the Al electrode 3. The other each of the fine metallic wire 4 is connected to one of the inner leads of a leadframe (not shown) on which the semiconductor chip is mounted. A protective layer 5 in the form of glass coating or Si oxide film is formed on the portion of the insulating film 2 where no Al electrode 3 is formed, and a package body 6 made of epoxy resin is molded to the Si substrate 1, the insulating film 2, the Al electrode 3, the fine metallic wires 4 and the protective layer 5.

Such a plastic packaged semiconductor device is manufactured by the following procedure: after the insulating film 2 is formed on the Si substrate 1, the Al electrode 3 and the protective layer 5 are formed on the insulating film 2, as shown in FIG. 2. Next, the end of the fine metallic wire 4 is bonded to the upper surface of the Al electrode 3, as shown in FIG. 3, and these components are then packaged in the package body 6.

In the above-described plastic packaged semiconductor device, the Si substrate 1, which is a major component of the semiconductor chip, has a linear expansion coefficient of $3 \times 10^{-6}$, and the package body 6 made of epoxy resin has a linear expansion coefficient about 10 times that of the Si substrate 1. This mismatch between the expansion coefficients of the Si substrate 1 and the package body 6 is directly responsible for stresses induced on the surface of the semiconductor chip, i.e., at the boundary of the protective layer 5 or the Al electrode 3 and the package body 6, and the stresses lead to generation of gaps therebetween. Stresses may be induced when the plastic packaged semiconductor device is subjected to thermal shock, e.g., during temperature cycling conducted in a reliability test or during soldering of external leads of the semiconductor device.

In the above-described plastic packaged semiconductor device which has gaps formed between the semiconductor chip and the package body 6 and, in particular, between the Al electrode 3 and the package body 6, water may enter the gaps as time elapses, thereby corroding the Al electrode 3 and reducing the reliability of the semiconductor device.

SUMMARY OF THE INVENTION

In view of the above-described problems of a conventional plastic packaged semiconductor device, an object of the present invention is to provide a plastic packaged semiconductor device in which gaps are not readily formed between the electrode of a semiconductor chip and a package body when the plastic packaged semiconductor device is subjected to thermal shock, and in which the problem of reduced reliability is eliminated.

To this end, the present invention provides a plastic packaged semiconductor device which comprises a semiconductor chip with electrode disposed the surface thereof, a package body made of a resin packaging the semiconductor chip, and an adhesion improving film disposed on these portions of the surface of the semiconductor chip which surrounding the electrode for enhancing the adhesion of the semiconductor chip to the package body.

DESCRIPTION OF THE PREFERRED EMBODIMENT

A preferred embodiment of the present invention will be described below with reference to the accompanying drawings.

Figure 1:
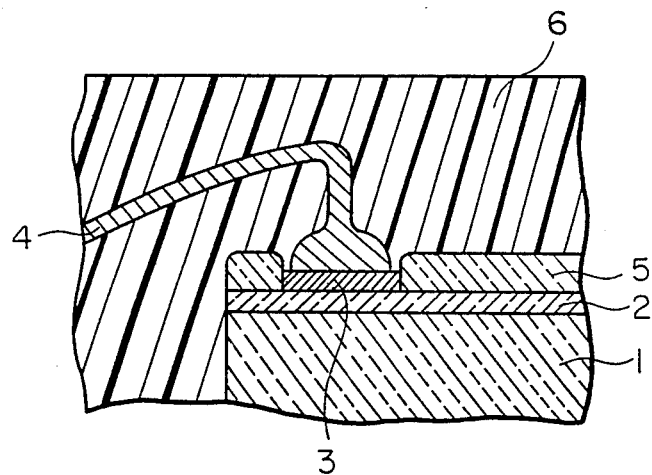
FIG. 1 is a cross-sectional view of part of a conventional resin molded semiconductor device.
Figure 2:
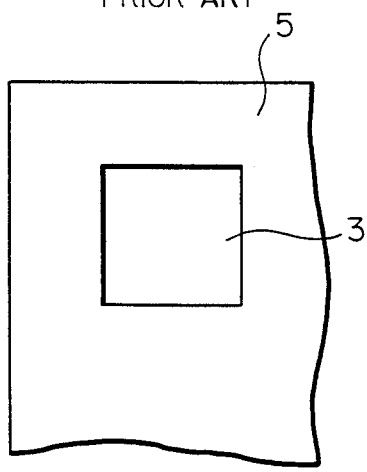
FIGS. 2 and 3 are plan views illustrating the manufacturing processes of the semiconductor device of FIG. 1.
Figure 3:
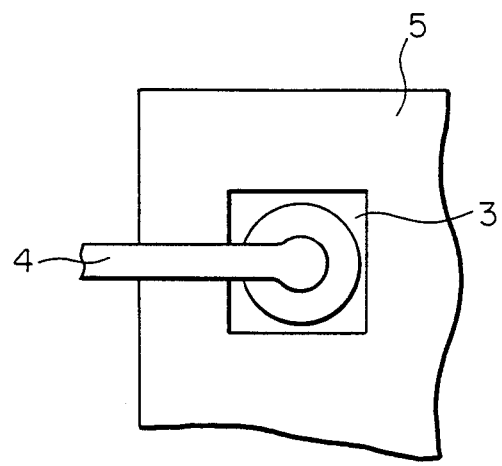
Figure 4:
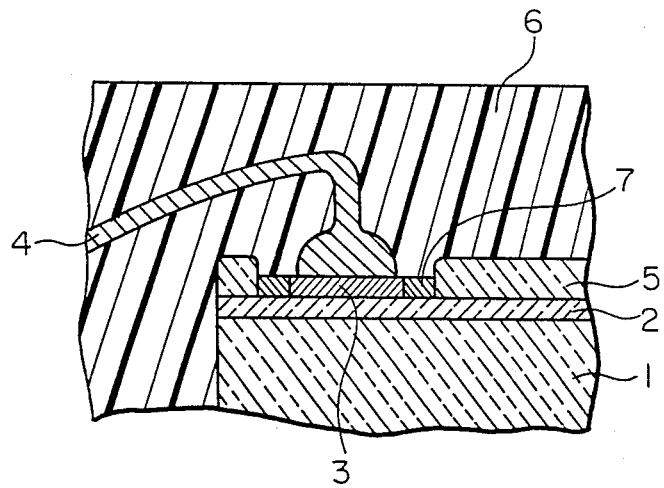
FIG. 4 is a cross-sectional view of part of a plastic packaged semiconductor device showing an embodiment of the present invention.

Referring first to FIG. 4, a semiconductor chip has a Si substrate 1, an insulating film 2 made of $SiO_2$ which is formed on the Si substrate 1, an Al electrode 3 disposed on a suitable portion of the insulating film 2, and a fine metallic wire 4 made of Au, which is bonded at one end to the surface of the Al electrode 3. The other end of the metal thin wires 4 is connected to one of the inner leads of a leadframe (not shown) on which the semiconductor chip is mounted.

The semiconductor chip also has nickel (Ni) oxide film 7 disposed on the portion of the surface of the insulating film 2 surrounding the Al electrode 3. The Ni oxide film 7, an adhesion improving film, and has a strong adhesion to the epoxy resin packaging the semiconductor chip.

The semiconductor chip further has a protective layer 5 disposed on the portion of the insulating film 2 where none of the Al electrode 3 and Ni oxide film 7 are disposed. The protective layer 5 may be formed of glass coating or a Si oxide film. The Si substrate 1, the insulating film 2, the Al electrode 3, the fine metallic wires 4, the protective film 5 and the Ni oxide film 7 are all molded in a package body 6 made of epoxy resin.

Figure 5:
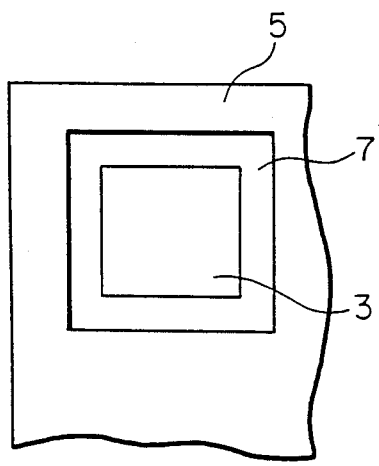
FIGS. 5 and 6 are plan views illustrating the manufacturing processes of the semiconductor device of FIG. 4.
Figure 6:
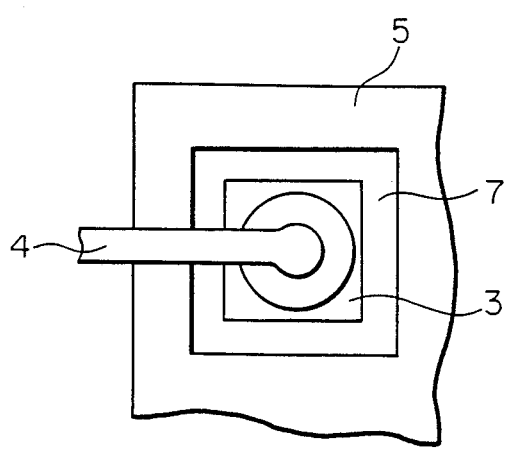

The plastic packaged semiconductor device of the above-described type is manufactured in the following procedure. First, the insulating film 2 is formed on the Si substrate 1, and the Al electrode 3 is formed on the insulating film 2, as shown in FIG. 5. Thereafter, the Ni oxide film 7 is formed on the insulating film 2 by a chemical vapor deposition method or by sputtering, surrounding the Al electrodes 3. The protective layer 5 is then formed on the portion of the insulating film 2 where none of Al electrode 3 and Ni oxide film 7 are formed, thereby completing formation of a semiconductor chip.

After this semiconductor chip is mounted on a leadframe (not shown), one each of the fine metallic wire 4 is bonded to the surface of the Al electrode 3, and the other end thereof is then connected to corresponding one of the inner leads of the leadframe. Thereafter, the semiconductor chip, the fine metallic wire 4 and the inner leads of the leadframe are molded in the package body 6.

Figure 7:
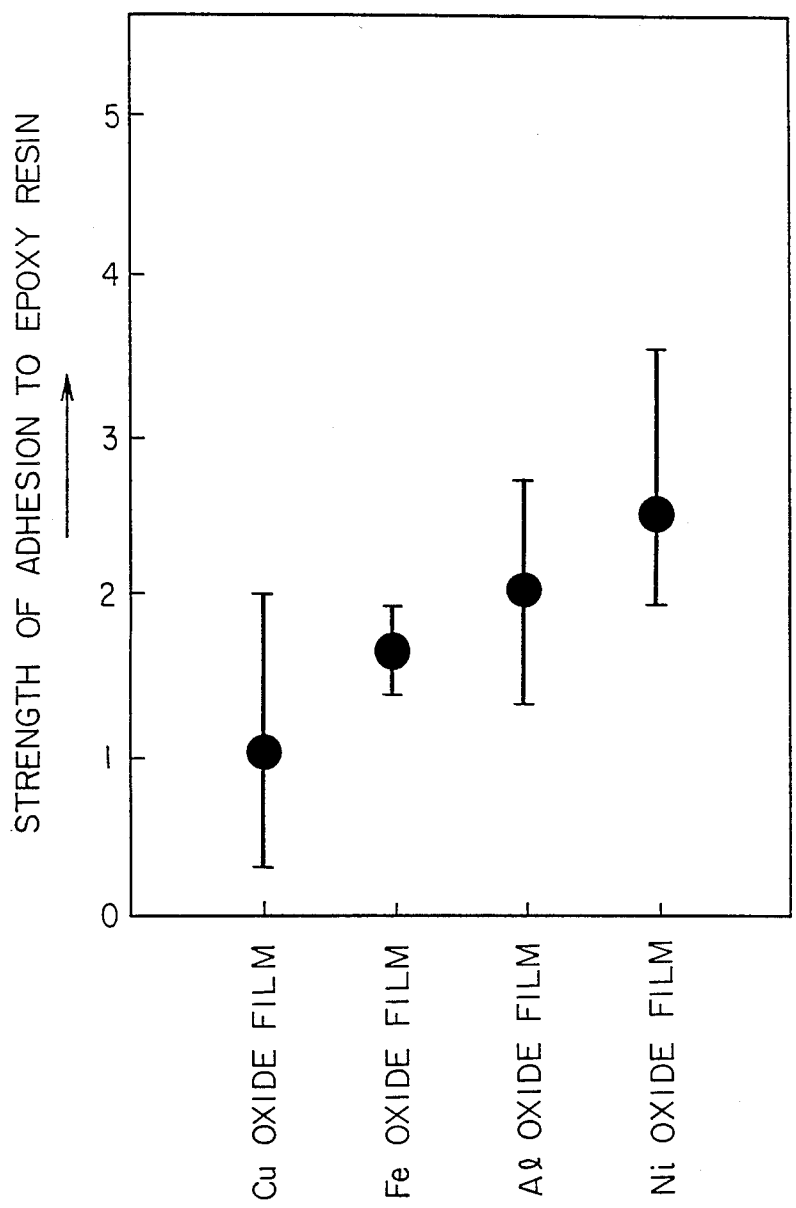
FIG. 7 is a graph showing the adhesion of various types of metal oxide films to an epoxy resin.

In order to estimate the strength of adhesion of the Ni oxide film 7 formed as the adhesion improving film to the package body 6 made of epoxy resin, the present inventor conducted experiments on the bonding strengths of various types of metal oxide film, including this Ni oxide film, to the epoxy resin. FIG. 7 shows the results of the experiments. As is apparent from FIG. 7, the Ni oxide film has stronger adhesion to the epoxy resin than the Al oxide film of the electrode 3 does.

Thus, in a plastic packaged semiconductor device with the Ni oxide films surrounding Al electrodes, the Ni oxide films are in such close contact to the package body that no gap is formed at the boundary of the Al electrodes 3 and the package body 6 even when the plastic packaged semiconductor device is subjected to thermal shock. In consequence, corrosion of the Al electrodes due to water, which may otherwise penetrate into the gaps, is prevented and the reliability of the plastic packaged semiconductor device is improved.

In the above-described embodiment, an epoxy resin is used to mold the semiconductor chip. However, this invention can be applied to a semiconductor device which is packaged with a resin other than epoxy resin. Further, the adhesion improving films are Ni oxide films. However, the present invention is not limited to this embodiment, and any material can be used as the adhesion improving films so long as it has stronger adhesion to the molding resin than does the material which forms the electrodes of the semiconductor chip.

What is claimed is:

1. A plastic packaged semiconductor device comprising:
    a semiconductor substrate having a surface and at least one electrode disposed on the surface;
    a protective film disposed on the surface of the substrate surrounding said at least one electrode;
    adhesion improving means disposed on the surface of said semiconductor substrate between said protective film and said at least one electrode surrounding said at least one electrode; and
    a resin package body encapsulating said semiconductor substrate, said at least one electrode, said protective film, and said adhesion improving means, said adhesion improving means enhancing the adhesion of said semiconductor substrate and electrode with said package body.

2. A plastic packaged semiconductor device according to claim 1, wherein said resin is an epoxy.

3. A plastic packaged semiconductor device according to claim 1 wherein said at least one electrode is aluminum.

4. A plastic packaged semiconductor device comprising:
    a semiconductor substrate having a surface and at least one electrode disposed on the surface;
    a protective film disposed on the surface of the substrate surrounding said at least one electrode;
    a nickel oxide film disposed on the surface of said semiconductor substrate between said protective film and said at least one electrode surrounding said at least one electrode; and
    a epoxy resin package body encapsulating said semiconductor substrate, said at least one electrode, said protective film, and said nickel oxide film, said nickel oxide film enhancing the adhesion of said semiconductor substrate and electrode with said epoxy resin package body.

5. A plastic packaged semiconductor device according to claim 4 wherein said resin is an epoxy.

UNITED STATES PATENT AND TRADEMARK OFFICE
CERTIFICATE OF CORRECTION

PATENT NO. : 4,974,052

DATED : November 27, 1990

INVENTOR(S) : Hideyuki Ichiyama

It is certified that error appears in the above-identified patent and that said Letters Patent is hereby corrected as shown below:

On the title page:
The Foreign Application Priority Data was omitted in the patent please insert.

--[30]     Foreign Application Priority Data

Oct. 14, 1988  [JP]   Japan ................ 63-257044--

Column 4, line 32, change "a" to --an--.

Signed and Sealed this

Sixteenth Day of June, 1992

*Attest:*

DOUGLAS B. COMER

*Attesting Officer*        *Acting Commissioner of Patents and Trademarks*